(12) United States Patent
Liu

(10) Patent No.: US 7,977,716 B2
(45) Date of Patent: Jul. 12, 2011

(54) CMOS IMAGE SENSOR WITH IMPROVED FILL-FACTOR AND REDUCED DARK CURRENT

(75) Inventor: XinQiao Liu, Mountain View, CA (US)

(73) Assignee: Fairchild Imaging, Inc., Milpitas, CA (US)

( * ) Notice: Subject to any disclaimer, the term of this patent is extended or adjusted under 35 U.S.C. 154(b) by 698 days.

(21) Appl. No.: 12/049,901

(22) Filed: Mar. 17, 2008

(65) Prior Publication Data

US 2009/0230436 A1 Sep. 17, 2009

(51) Int. Cl.
*H01L 27/00* (2006.01)

(52) U.S. Cl. ........ 257/292; 257/291; 257/288; 257/212; 257/691; 257/723; 438/107

(58) Field of Classification Search ........... 257/E27.132, 257/292, 291, 288, 212, 691, 723, 724; 345/182, 345/207; 438/107
See application file for complete search history.

(56) References Cited

U.S. PATENT DOCUMENTS

| | | | |
|---|---|---|---|
| 2004/0173864 A1 | 9/2004 | Inagaki | 257/443 |
| 2006/0208163 A1* | 9/2006 | Manabe et al. | 250/208.1 |
| 2007/0045679 A1 | 3/2007 | McKee | 257/291 |
| 2007/0210239 A1 | 9/2007 | Lee et al. | |

OTHER PUBLICATIONS

International Search Report, PCT/US2009/035943, Oct. 27, 2009, all pages.

* cited by examiner

*Primary Examiner* — Zandra Smith
*Assistant Examiner* — Tsz K Chiu
(74) *Attorney, Agent, or Firm* — Calvin B. Ward

(57) ABSTRACT

A photosensor and an imaging array utilizing the same are disclosed. The photosensor includes a light conversion region that has separate charge storage regions. The light conversion region includes a plurality of separate charge storage regions within a doped region, each charge collection region being doped such that the mobile charges generated by light striking that charge storage region are prevented from moving to an adjacent charge storage region. The photosensor also includes a plurality of transfer gates, having a gate region adjacent to a corresponding one of the charge storage regions and disposed between that charge storage region and a drain region. The charge collection regions and the drain regions are doped such that the mobile charges collected in the charge storage region will flow to the drain region when a first electric field is applied to the gate region.

11 Claims, 7 Drawing Sheets

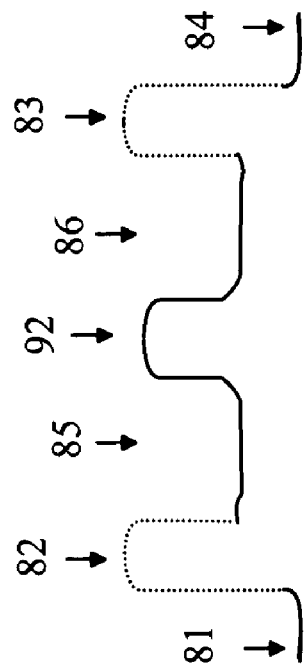
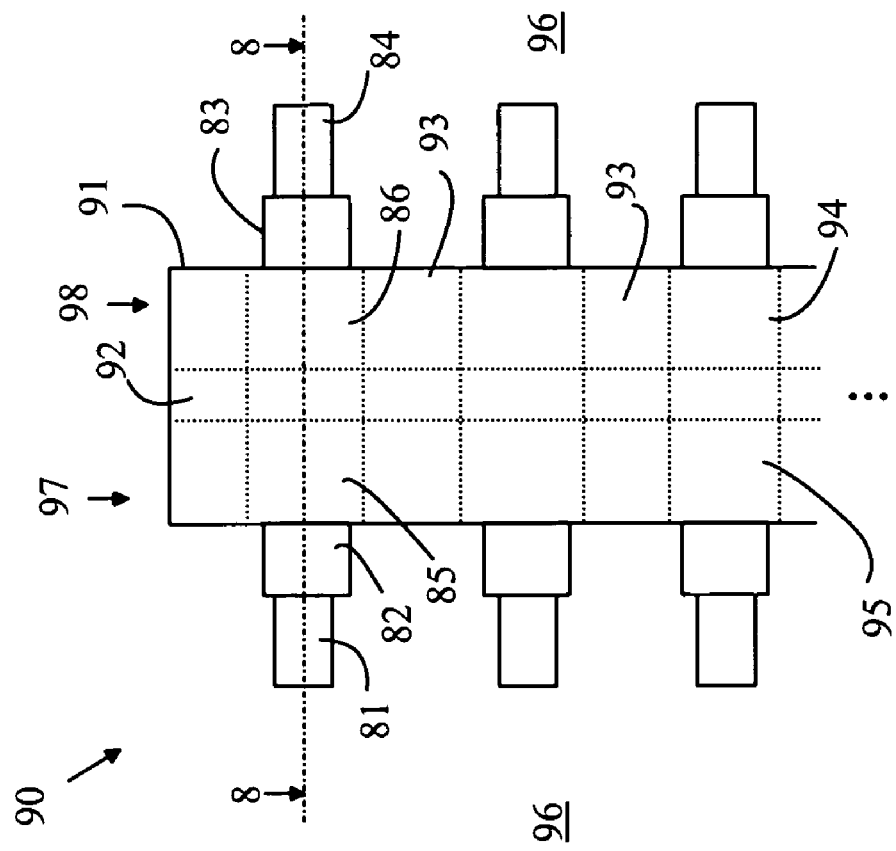

CMOS IMAGE SENSOR WITH IMPROVED FILL-FACTOR AND REDUCED DARK CURRENT

BACKGROUND OF THE INVENTION

The development of inexpensive digital cameras has resulted in the incorporation of cameras in a number of other products. For example, cellular telephones and PDAs are commonly equipped with cameras. While the initial cameras provided with the devices were of limited resolution, recent improvements in CMOS imaging arrays have resulted in cameras with more than two million pixels for such applications.

Further improvements in resolution and cost for such cameras could be obtained if the size of the pixels in the imaging array could be reduced. The cost of the camera is directly related to the area of silicon occupied by the imaging array and the accompanying circuitry. The imaging array occupies the majority of this area. Hence, to increase the number of pixels or to decrease the cost of a camera with the current number of pixels, the area of silicon must be reduced. The area of silicon, in turn, is determined by the size of the pixels in the imaging array.

A typical CMOS imaging array includes a two-dimensional array of pixel sensors that is organized as a plurality of rows and columns of pixel sensors. Each pixel sensor measures the light intensity at a corresponding point in the image for light of a particular color. Each pixel sensor includes a photodiode that converts light to an electronic charge that is stored in the photodiode until the photodiode is readout. Each pixel also includes one or more transistors that are used to generate a signal that is proportional to the stored charge and to couple that signal to a corresponding bus during the readout process.

The area of the photodiode determines the light sensitivity of the pixel sensor, hence, modifications in the imaging array that reduce the size of the active area of the photodiode also reduce the light sensitivity of the array. Accordingly, schemes for reducing the pixel sensor without lowering the light sensitivity of the camera are of interest. For example, in one scheme, a number of photodiodes share the same charge-to-voltage converter to reduce the area of silicon devoted to processing circuitry as opposed to light conversion.

To reduce the area of each pixel sensor further, either the noise levels of the individual photodiodes must be reduced or the dead space around each photodiode must be reduced. In general, each photodiode is an implant of a first semiconductor type in a substrate of a second semiconductor type. The wells are spaced apart from one another. The space between the photodiodes is effectively dead space in that it neither efficiently collects the charge nor provides space for processing circuitry.

Similarly, all photodiodes exhibit a "dark" current. That is, even in the absence of light, charge accumulates in the photodiode at some rate. In practice, the photodiodes are reset just prior to an image being projected onto the imaging array to remove any accumulated charge. However, there is always some delay between the reset and the image exposure during which the charge from the dark current accumulates. In addition, the dark current continues to accumulate even in the presence of light from the exposure. Finally, the dark current accumulates from the time the shutter is closed on the camera to the time the pixels are read out. Hence, the dark current represents a lower limit in the light sensitivity of the array, since, as the light levels decrease, a point is reached at which the dark current is the size or greater than the "light" current.

Modern CMOS manufacturing uses shallow trench isolation (STI) technology to isolate individual transistors and photodiodes. The interface between STI and the photodiode sidewall is known to have the highest dark current generation rate. Hence, as the pixel area is reduced to decrease the size of the imaging area, the ratio of the dark current to light current increases.

SUMMARY OF THE INVENTION

The present invention includes a photosensor and an imaging array utilizing the same. The photosensor includes a light conversion region that has separate charge storage regions. The light conversion region converts photons in an optical band to mobile charges, and includes a doped region of a first conductivity type. The light conversion region includes a plurality of separate charge storage regions within the doped region, each charge collection region being doped such that the mobile charges generated in that charge storage region are prevented from moving to an adjacent charge storage region. The photosensor also includes a plurality of transfer gates, each transfer gate having a gate region adjacent to a corresponding one of the charge storage regions and disposed between that charge storage region and a drain region. The charge collection regions and the drain regions are doped such that the mobile charges collected in the charge storage region will flow to the drain region when a first electric field is applied to the gate region, and the mobile charges collected in the charge collection region are inhibited from flowing to the drain region when a second electric field is applied to the gate region.

In one aspect of the invention, the mobile charges are electrons. In another aspect of the invention, adjacent charge storage regions are separated by barrier regions having a different doping density from the charge storage regions. The mobile charges generated in one of the barrier regions move to one of the charge storage regions adjacent to that barrier region.

In yet another aspect of the invention, the charge storage regions can be divided into a plurality of groups of charge storage regions. Each group of charge storage regions includes a plurality of separate charge storage regions, the drain regions of the charge storage regions in one of the groups being connected to a common circuit node corresponding to that group. The photosensor can also include a reset circuit for connecting the common circuit node to a predetermined potential in response to a reset signal, and a charge-to-voltage conversion circuit connected to the common circuit node. The charge-to-voltage circuit generates an output voltage related to a charge on the common circuit node on an output node, the output node is connected to a first bit line in response to an output signal that is coupled to the charge-to-voltage conversion circuit.

In a further aspect of the invention, the charge storage regions are organized as first and second columns of charge storage regions. The first column of charge storage regions is disposed parallel to the second column of charge storage regions. The charge storage regions in the first column of charge storage regions are connected to an output circuit that generates signals representing charges stored in the first column of charge storage regions on a first bit line, and the second column of charge storage regions are connected to an output circuit that generates signals representing charges in the second column of charge storage regions on a second bit line that is different from the first bit line.

BRIEF DESCRIPTION OF THE DRAWINGS

FIG. 7 is a top view of a portion of a two charge storage region column structure.

FIG. 8 is a cross-sectional view through line 8-8 shown in FIG. 7.

DETAILED DESCRIPTION OF THE PREFERRED EMBODIMENTS

Figure 1:
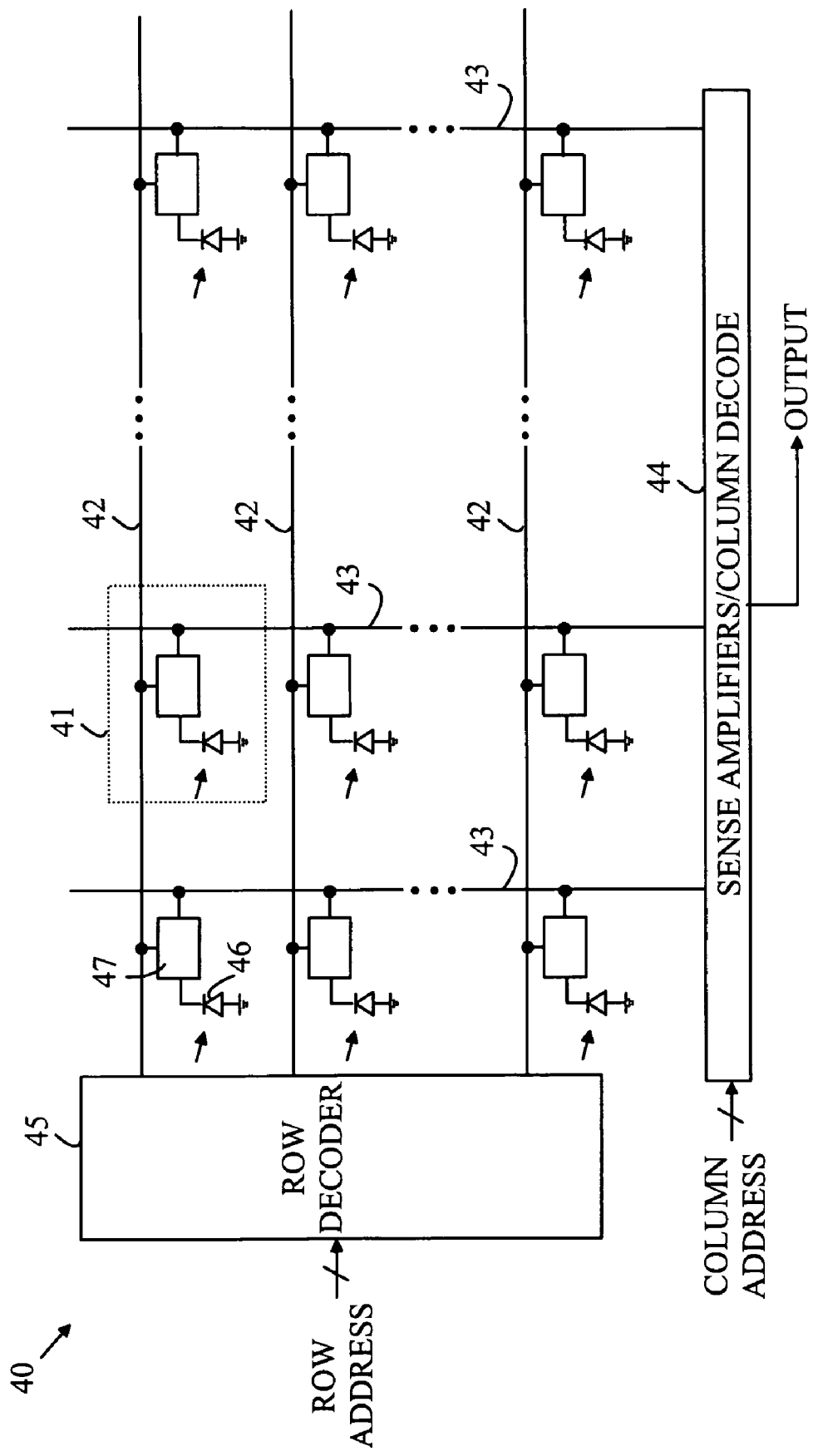
FIG. 1 is a schematic drawing of a prior art CMOS imaging array of the type normally used with dental sensors.

The manner in which the present invention provides its advantages can be more easily understood with reference to FIG. 1, which is a schematic drawing of a prior art CMOS imaging array. Imaging array 40 is constructed from a rectangular array of pixel sensors 41. Each pixel sensor includes a photodiode 46 and an interface circuit 47. The details of the interface circuit depend on the particular pixel design. However, all of the pixel sensors include a gate that is connected to a row line 42 that is used to connect that pixel sensor to a bit line 43. The specific row that is enabled at any time is determined by a row address that is input to a row decoder 45. The row select lines are a parallel array of conductors that run horizontally in the metal layers over the substrate in which the photodiodes and interface circuitry are constructed.

The various bit lines terminate in a column processing circuit 44 that typically includes sense amplifiers and column decoders. The bit lines are a parallel array of conductors that run vertically in the metal layers over the substrate in which the photodiode and interface circuitry are constructed. Each sense amplifier reads the signal produced by the pixel that is currently connected to the bit line processed by that sense amplifier. The sense amplifiers may generate a digital output signal by utilizing an analog-to-digital converter (ADC). At any given time, a single pixel sensor is readout from the imaging array. The specific column that is readout is determined by a column address that is utilized by a column decoder to connect the sense amplifier/ADC output from that column to circuitry that is external to the imaging array.

Figure 2:
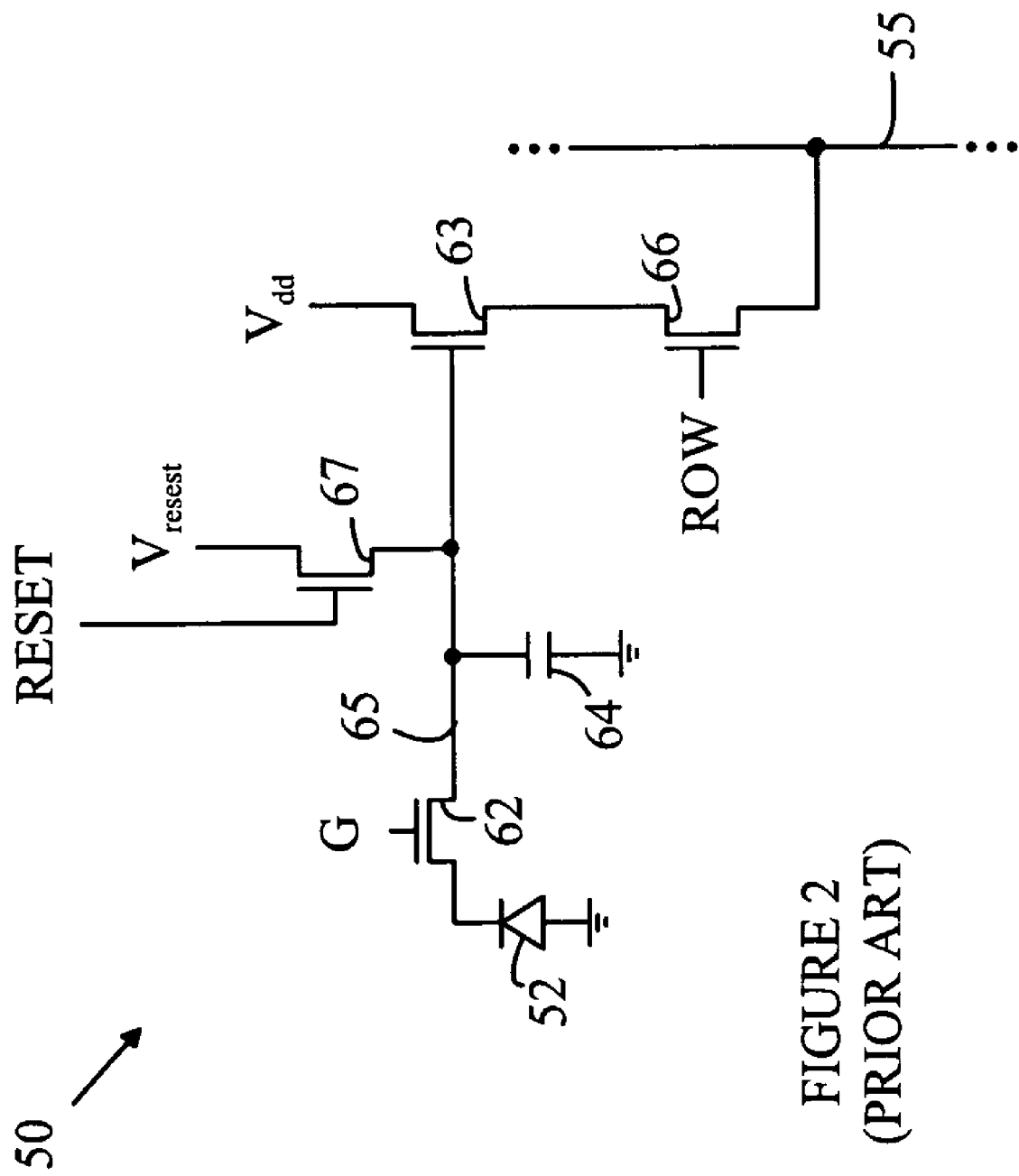
FIG. 2 is a schematic drawing of a typical prior art four transistor pixel.

Refer now to FIG. 2, which is a schematic drawing of a typical prior art 4 transistor pixel. Pixel 50 includes photodiode 52 that is connected to a node 65 by a gate transistor 62 in response to a G signal being asserted. Transistor 63 is connected as a source follower and provides the gain needed to drive the bit line 55. Node 65 includes a parasitic capacitance 64 that converts the charge that is transferred from photodiode 52 to a voltage that is output by transistor 63 when row select transistor 66 is placed in the conducting state by asserting a ROW signal. Photodiode 52 is reset by connecting photodiode 52 to a reset potential, $V_{reset}$, through gate 67.

To provide low noise, all of the electrons must be removed from the photodiodes when the photodiodes are reset at the beginning of an exposure. To assure complete reset, pinned photodiodes are utilized. In a pinned photodiode, the charge generated by the photons is stored in a potential well in the photodiode. The storage region is adjacent to gate transistor 62. The charge storage region is at a higher potential than the drain of the gate transistor and node 65. When the gate transistor is placed in a conductive state, all of the charge moves out of the gate onto the capacitor 64. Photodiode 52 is reset by connecting the photodiode to $V_{reset}$, which is set such that any charge remaining on photodiode 52 is removed and node 65 is set to the same potential in each pixel. Without complete charge transfer, the sensor will suffer from image lag, a phenomenon in which a ghost of the image from the previous frame is visible in the current frame.

Figure 3:
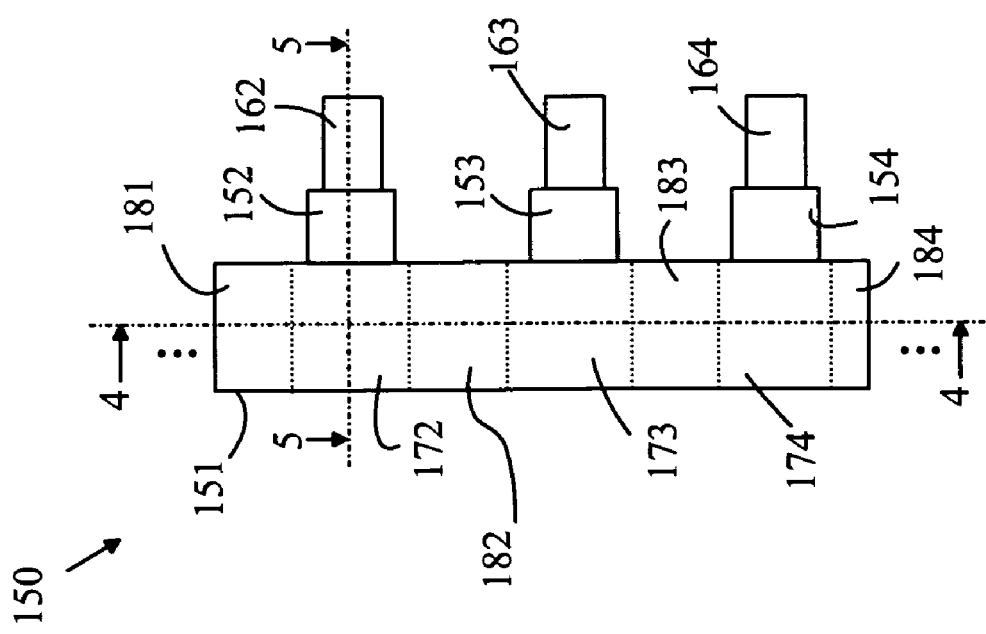
FIG. 3 is a top view of a portion of a column of photodiodes according to one embodiment of the present invention.

Refer now to FIG. 3, which is a top view of a portion of a column of photodiodes according to one embodiment of the present invention. Column 150 has a long narrow light conversion region 151, which is constructed from an n-type implant in a p-type substrate. Light conversion region 151 is rectangular in shape and has three gate transistors fabricated along the length of the light conversion region. The gates of the gate transistors are shown at 152-154. When an appropriate potential is applied to each gate, charge trapped in light conversion region 151 adjacent to that gate can flow to the drain of the corresponding transistor. The drains of the transistors corresponding to gates 152-154 are shown at 162-164, respectively.

Light conversion region 151 includes three implant regions, 172-174 that are more heavily doped than the remainder of light conversion region 151. These implant regions are separated by barrier regions 181-184. These implant regions accumulate photoelectrons that are generated in these regions and in the surrounding less heavily doped regions. These implant regions will be referred to as charge storage regions in the following discussion.

Figure 4:
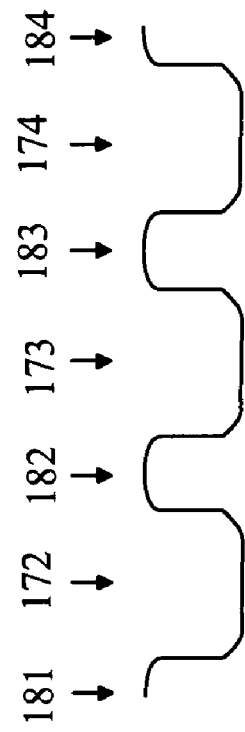
FIG. 4 is a graph of the potential along line 4-4 shown in FIG. 3.
Figure 5A:
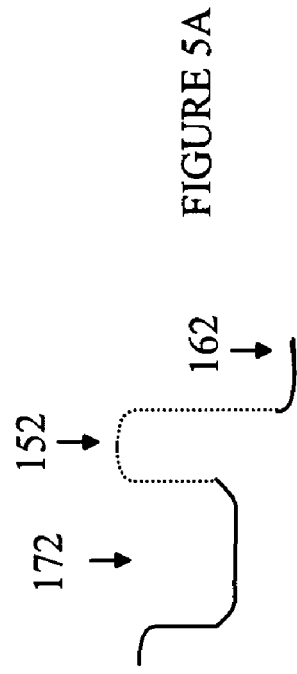
FIGS. 5A and 5B are graphs of the potential energy as seen by a photoelectron when different gate voltages are applied to the gate as shown along line 5-5 in FIG. 3.
Figure 5B:
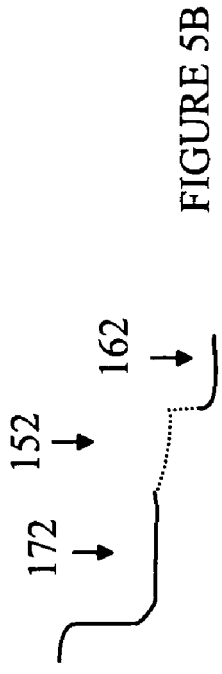

Refer now to FIGS. 4, 5A, and 5B. FIG. 4 is a graph of the potential along line 4-4 shown in FIG. 3. FIGS. 5A and 5B are graphs of the potential energy as seen by a photoelectron along line 5-5 shown in FIG. 3 when different gate voltages are applied to gate 152. As can be seen in FIG. 4, the charge storage regions are regions of low potential energy. Photoelectrons that are generated within a charge storage region are trapped in that charge storage region until the potential on the gate that is adjacent to that charge storage region is altered as described below. Photoelectrons that are generated in region 181 are swept into charge storage region 172. Similarly, photoelectrons that are generated in region 182 will either be swept into charge storage region 172 or 173 depending on the position in region 182 at which the photoelectrons are generated.

Each charge storage region and the regions around it that contribute electrons to the charge stored in the charge collection region can be viewed as a separate photodiode that is accessed by the gate transistor that is adjacent to that charge storage region. During the period in which charge is being accumulated, the potential on the gates of the gate transistors is maintained such that charge remains trapped in the charge storage region as shown in FIG. 5A. To readout the stored charge, the potential on the corresponding gate is altered as shown in FIG. 5B, and the charge flows onto the drain of the gate transistor that is at a potential below that of the charge storage regions.

It should be noted that there is no dead space between the charge collection regions. Photoelectrons generated in the regions between the charge storage regions move to the closest charge storage region, and hence, all of the area in the implant is effectively utilized in detecting the incoming light. In addition, there are no shallow trench isolation (STI) features implemented to separate the charge storage regions, and hence, the dark current is substantially reduced compared to conventional photodiode structures. Hence, the size of the effective photodiodes can be reduced to provide smaller pixels that have reduced dark current and the same photon conversion area as conventional pixels.

Each charge storage region and its associated gate transistor could be utilized as a separate photodiode in an imaging array in place of photodiode 52 and gate transistor 62 shown in FIG. 2. In this case, a column of charge storage regions replaces each column of photodiodes in each column of pixels. The column of charge storage regions could be implemented as a single long implant that spans the entire height of the imaging array. Alternatively, the implant could be broken into sections in which a plurality of charge storage regions are located in each section.

Figure 6:
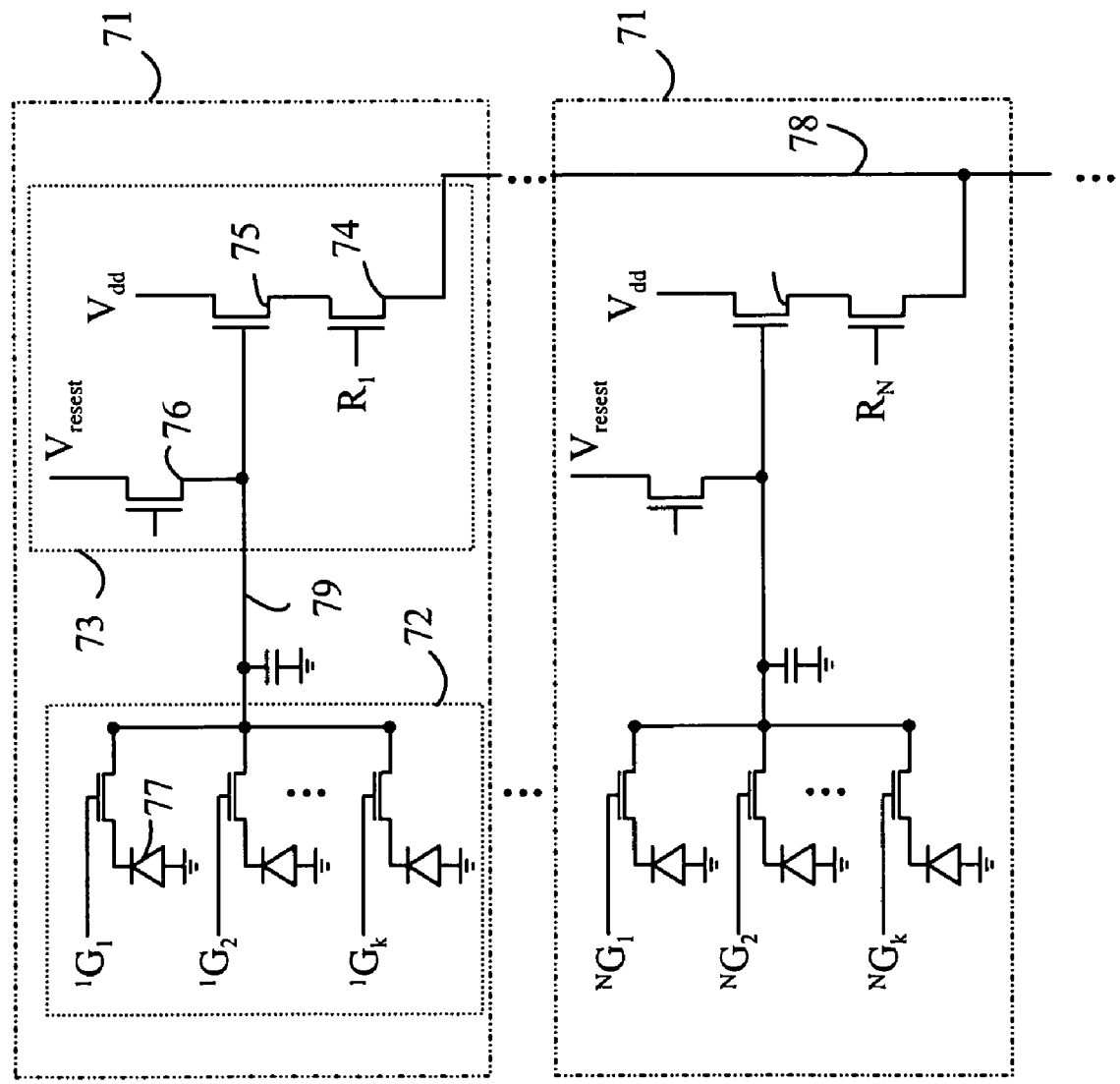
FIG. 6 is a schematic drawing of a single column of charge storage regions that are connectable to a bit line.

The above-described embodiments utilize one active gain transistor per charge storage region. However, embodiments in which a number of column storage regions share a single gain transistor or amplifier could also be constructed. Refer now to FIG. 6, which is a schematic drawing of a single column of charge storage regions that are connectable to a bit line 78. The column of charge storage regions is divided into N groups of charge storage regions 71. Each group includes a contiguous block of k charge storage regions 77 as shown at 72. The gate transistor for each charge storage region is connected to a separate gate line that is used to connect that charge storage region to node 79 in that group. The charge delivered to node 79 when a gate is placed in the conducting state is processed by a gain section 73 that includes a source follower 75 and a gate transistor 74 for connecting the output of the source follower to bit line 78 when a group signal $R_1$ is applied to transistor 74.

The charge in each charge storage region is readout as follows. First, node 79 is reset to $V_{reset}$ by placing transistor 76 in the conducting state. Transistor 76 is then returned to the non-conducting state and one of the gate control lines is asserted to transfer the charge in the corresponding charge storage region to node 79. The group signal corresponding to the group in question is then asserted on transistor 74 to output the voltage corresponding to the charge to bit line 78. The process is then repeated for each remaining charge storage region until all of the charge storage regions have been readout. The charge storage regions are reset prior to the next exposure by connecting all of the charge storage regions to node 79 and then placing transistor 76 in the conducting state for a predetermined period of time.

The above-described embodiments of the present invention utilize a structure having a single column of charge storage regions within the implanted region. These embodiments eliminate the dead space in the vertical direction between adjacent photodiodes that existed in prior art imaging arrays. However, there is still dead space horizontally between the columns of charge storage regions. This horizontal dead space can be reduced significantly by utilizing a structure in which there are two columns of adjacent charge storage regions within each implant area.

Refer now to FIG. 7 which is a top view of a portion of a two charge storage region column structure and to FIG. 8, which is a cross-sectional view through line 8-8 shown in FIG. 7. The two column structure 90 is constructed from an n-type implant 91 in a p-type substrate 96. Within region 91, the doping levels are varied to provide two columns 97 and 98 of charge storage regions separated by barriers that isolate each charge storage region while allowing photoelectrons generated in the barrier regions to be collected in one of the adjacent charge storage regions. The columns are separated horizontally by barrier 92, and each pair of charge storage regions are separated vertically by barriers 93. Exemplary charge storage regions are shown at 85, 86, 95, and 94. Each charge storage region has a corresponding gate transistor that is constructed adjacent to that charge storage region. The gate transistor for charge storage region 85 includes the gate electrode 82 and drain region 81. Similarly, the gate transistor for charge storage region 86 includes gate electrode 83 and drain region 84. The potential energy of electrons in the charge storage regions is less than that in the barrier regions, but greater than that in the drain regions.

Refer now to FIG. 8, which illustrates the potential energy of an electron in the various regions of the two-column structure along line 8-8 shown in FIG. 7. The gate electrodes provide a variable barrier that allows the electrons stored in a charge storage region to flow out to the drain of the corresponding gate transistor when the potential is set to one state, while providing a barrier that keeps the electrons trapped in the charge storage region when the potential is set to the second state.

Refer again to FIG. 7. The space that would normally separate two columns of pixels with STI in a conventional imaging array has been replaced by barrier region 92. Electrons that are generated within this region contribute to one of the charge storage regions that is adjacent to the site at which the photoelectron was created. The charge storage region in question will typically be the closest charge storage region to the site. Hence, the STI region that would normally exist between columns of photodiodes has been eliminated, and as a result, the two columns can be placed much closer to have a smaller pixel. In addition, the dark current is greatly reduced with the elimination of STI to photodiode interface.

As noted with respect to FIG. 6, additional dead space within the array can be reduced by sharing the readout electronics between a number of different charge storage regions. The number of charge storage regions that can share a particular readout circuit is limited by the distance between the charge storage regions and the readout circuit. In the embodiment shown in FIG. 6, groups of charge storage regions in a column shared the same readout circuitry. To reduce the dead space further, arrangements in which adjacent columns of charge storage regions share the same readout circuitry can be utilized to maximize the number of charge storage regions that are within range of a given readout circuit.

Figure 9:
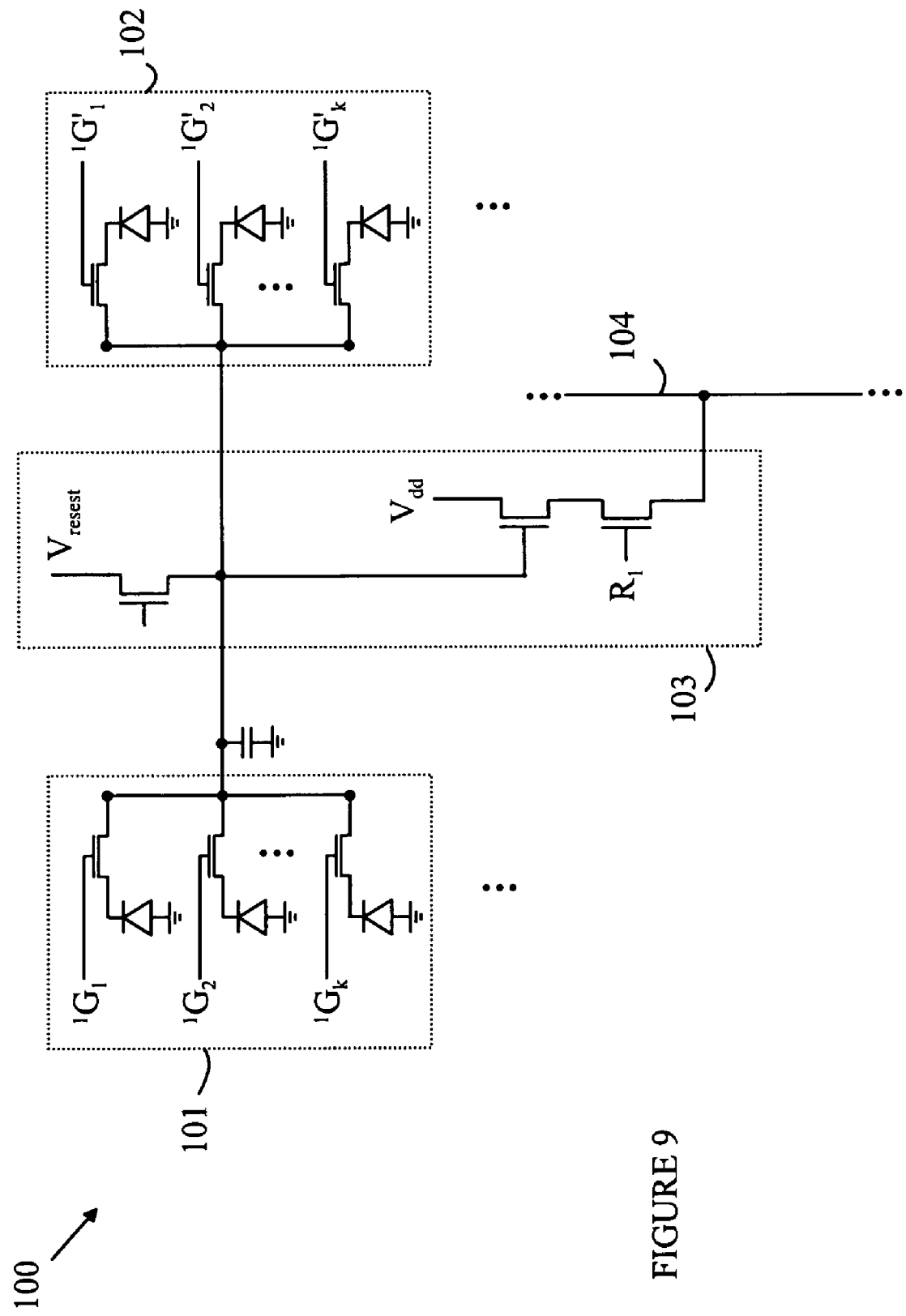
FIG. 9 is a schematic drawing of a portion of two columns of charge storage regions that share a common readout circuit.

Refer now to FIG. 9, which is a schematic drawing 100 of a portion of two columns of charge storage regions that share a common readout circuit. A group of charge storage regions in the first column is shown at 101, and the corresponding group of charge storage regions in the second column is shown at 102. Groups 101 and 102 share readout circuit 103. At any given time, one charge storage region from one of the groups is connected to a bit line 104 that is shared by both columns. Since the gate control lines in the two groups must be separately addressable, the control lines for one column are different than the control lines for the corresponding charge storage regions in the other column.

The above-described embodiments of the present invention utilize a readout circuit having a single transistor as the gain stage, namely the source follower. Refer again to FIG. 2. The charge conversion gain of the readout circuit is determined by capacitor 64 shown in FIG. 2. If the capacitance is large, the change in voltage on node 65 when the charge from photodiode 52 is transferred to node 65 will be small. If the change is too small, the signal could be corrupted by noise. To provide a large gain, the capacitance of capacitor 64 must be as small as possible. However, the circuit designer is not free to set this capacitance, since the capacitance is determined by the parasitic capacitance of the node. In embodiments such as those discussed above in which a number of charge storage regions are connected to the same node, the capacitance will be increased over embodiments in which a single photodiode or charge storage region is connected to the node.

Figure 10:
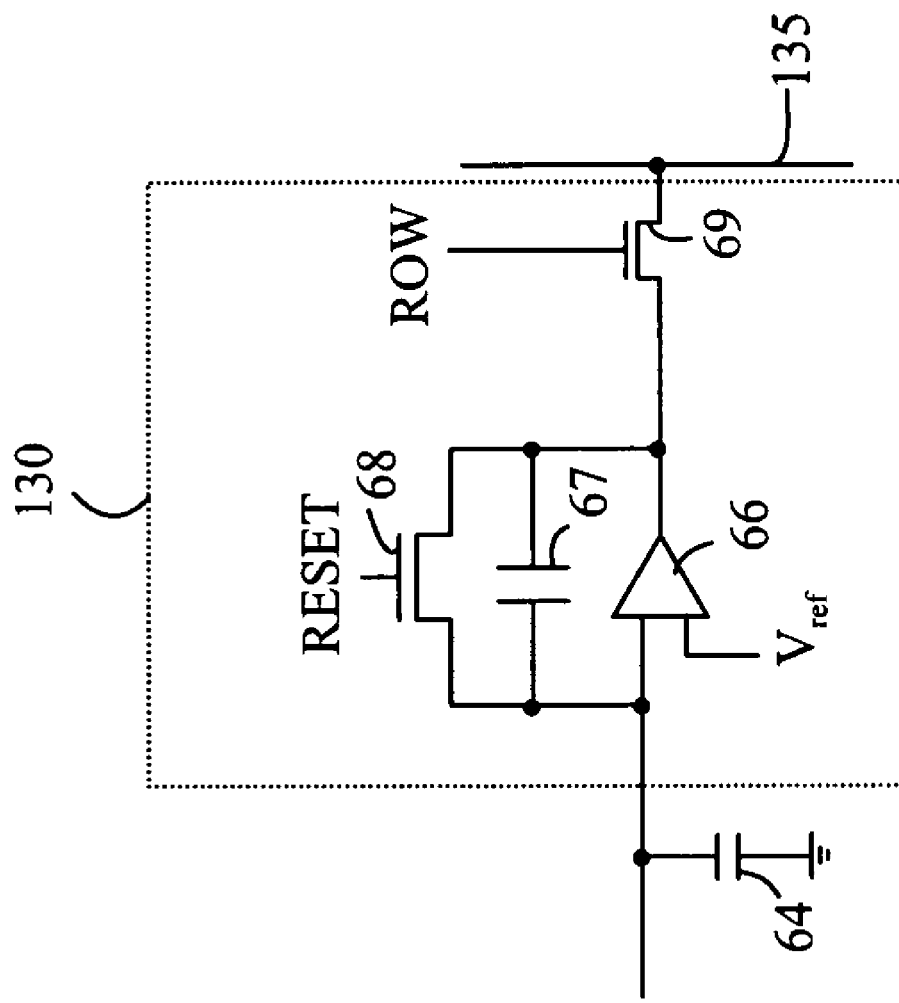
FIG. 10 is a schematic drawing of a charge conversion circuit connected to a bit line.

This problem can be overcome by utilizing a charge conversion circuit that can provide a voltage gain. A capacitive transimpedance amplifier is well suited for this type of charge conversion circuit. Refer now to FIG. 10, which is a schematic drawing of a charge conversion circuit 130 connected to a bit line 135. Charge conversion circuit 130 includes an amplifier 66 with a capacitive feedback loop through capacitor 67. The voltage gain provided by amplifier 66 depends on the ratio of the capacitances of capacitors 67 and 64. Prior to reading out the charge from one of the charge storage regions, the readout circuit is reset by placing transistor 68 in a conducting state while connecting the output of amplifier 66 to bit line 135 which is held at the appropriate potential during the reset process. The charge storage regions are likewise reset in the same manner by placing the gate transistor in a conducting state while transistors 68 and 69 are in the conducting state.

To create the potential barrier between charge storage regions such as regions 92 and 93 shown in FIG. 7, different implant doses could be utilized. In one embodiment, the entire region 91 receives a first n-type implant at $2.0 \times 10^{12}$ atoms per square centimeter, and regions 85, 86, 94, 95 receive an additional second n-type implant at $1.0 \times 10^{12}$ atoms per square centimeter.

Various modifications to the present invention will become apparent to those skilled in the art from the foregoing description and accompanying drawings. Accordingly, the present invention is to be limited solely by the scope of the following claims.

What is claimed is:

1. A photosensor comprising:
    a light conversion region that converts photons in an optical band to mobile charges, said light conversion region comprising a continuous doped region of a first conductivity type in a region of a second conductivity type;
    a plurality of separate charge storage regions of said first conductivity type separated by barriers of said first conductivity type within said doped region, each charge storage region being doped relative to said barriers such that said mobile charges generated in that charge storage region are prevented from moving to an adjacent charge storage region; and
    a plurality of transfer gates, each transfer gate comprising a gate region adjacent to a corresponding one of said charge storage regions and disposed between that charge storage region and said drain region,
    wherein said charge collection regions and said drain regions are doped such that said mobile charges collected in said charge storage region will flow to said drain region when a first electric field is applied to said gate region and wherein said mobile charges collected in said charge collection region are inhibited from flowing to said drain region when a second electric field is applied to said gate region.

2. The photosensor of claim 1 wherein said mobile charges comprise electrons.

3. The photosensor of claim 1 wherein adjacent charge storage regions are separated by barrier regions having a different doping density from said charge storage regions, and wherein mobile charges generated in one of said barrier regions move to one of said charge storage regions adjacent to that barrier region.

4. The photosensor of claim 1 wherein said charge storage regions are divided into a plurality of groups of charge storage regions, each group of charge storage regions comprising a plurality of separate charge storage regions, said drain regions of said charge storage regions in one of said groups being connected to a common circuit node corresponding to that group.

5. The photosensor of claim 4 further comprising a reset circuit for connecting said common circuit node to a predetermined potential in response to a reset signal.

6. The photosensor of claim 4 further comprising a charge-to-voltage conversion circuit connected to said common circuit node, said charge-to-voltage circuit generating an output voltage related to a charge on said common circuit node on an output node, said output node being connected to a first bit line in response to an output signal being coupled to said charge-to-voltage conversion circuit.

7. The photosensor of claim 1 wherein said charge storage regions are organized as first and second columns of charge storage regions, said first column of charge storage regions being disposed parallel to said second column of charge storage regions, said first column of charge storage regions being separated from said second column of charge storage regions by said barrier region, charge storage regions in said first column of charge storage regions being connected to an output circuit that generates signals representing charges stored in said first column of charge storage regions on a first bit line and said second column of charge storage regions being connected to an output circuit that generates signals representing charges in said second column of charge storage regions on a second bit line that is different from said first bit line.

8. An imaging array comprising:
    first and second light conversion regions that convert photons in an optical band to mobile charges, each light conversion region comprising:
    a plurality of separate charge storage regions within said doped region, each charge storage region being doped such that said mobile charges generated in that charge storage region are prevented from moving to an adjacent charge storage region; and
    a plurality of transfer gates, each transfer gate comprising a gate region adjacent to a corresponding one of said charge storage regions and disposed between that charge storage region and said drain region,
    wherein said charge storage regions and said drain regions are doped such that said mobile charges collected in said charge storage region will flow to said drain region when a first electric field is applied to said gate region and wherein said mobile charges collected in said charge collection region are inhibited from flowing to said drain region when a second electric field is applied to said gate region; and
    a bit line, said charge storage regions in each of said first and second light conversion regions being connected to said bit line by an output circuit that generates signals representing charges stored in said charge storage regions on said bit line.

9. The imaging array of claim 8 wherein said output circuit comprises a plurality of common nodes, each common node being connected to a plurality of drain regions in said first light conversion region and a plurality of drain regions in said second light conversion region.

10. The imaging array of claim 9 further comprising a reset circuit for connecting said common circuit node to a predetermined potential in response to a reset signal.

11. The imaging array of claim 9 further comprising a charge-to-voltage conversion circuit connected to said common circuit node, said charge-to-voltage circuit generating an output voltage related to a charge on said common circuit node on an output node, said output node being connected to a first bit line in response to an output signal being coupled to said charge-to-voltage conversion circuit.

* * * * *